US007189645B1

(12) United States Patent
Deshmukh (10) Patent No.: US 7,189,645 B1
(45) Date of Patent: Mar. 13, 2007

(54) SYSTEM AND METHOD FOR ADJUSTING THE RATIO OF DEPOSITION TIMES TO OPTIMIZE VIA DENSITY AND VIA FILL IN ALUMINUM MULTILAYER METALLIZATION

(75) Inventor: Abhay Ramrao Deshmukh, Arlington, TX (US)

(73) Assignee: National Semiconductor Corporation, Santa Clara, CA (US)

( * ) Notice: Subject to any disclaimer, the term of this patent is extended or adjusted under 35 U.S.C. 154(b) by 51 days.

(21) Appl. No.: 10/924,659

(22) Filed: Aug. 24, 2004

Related U.S. Application Data

(60) Provisional application No. 60/565,340, filed on Apr. 26, 2004.

(51) Int. Cl.
*H01L 21/44* (2006.01)
*H01L 23/52* (2006.01)

(52) U.S. Cl. .................................... 438/668; 257/765
(58) Field of Classification Search ............... 257/736, 257/750, 765, 771, 773–775; 438/605, 614, 438/668, 672, 675, 688
See application file for complete search history.

(56) References Cited

U.S. PATENT DOCUMENTS 4,994,162 A 2/1991 Armstrong et al.
5,108,951 A 4/1992 Chen et al.

6,627,547 B2 9/2003 Geha

OTHER PUBLICATIONS

Guo, Ted, et al., "A Low Temperature Integrated Aluminum Metallization Technology for ULSI Devices," Thin Solid Films 332 (1998), pp. 319-324.
Robl, W., et al., "Physical Properties and Integration Aspects of High Pressure Aluminum Interconnects," Conference Proceedings ULSI XIII, 1998, Materials Research Society, pp. 251-255.
Zhao, B., et al., "A Novel Low Temperature PVD Planarized Al-Cu Process for High Aspect Ratio Sub-Half Micron Interconnect," IEEE, 1996, pp. 353-356.
Yun, Jong-Ho, et al., "Submicron Via-Hole Filling Using Al Low-Pressure Seed Process," Jpn. J. Appl. Phys. vol. 40 (2001), pp. 5105-5108, Part 1, No. 8, Aug. 2001.
Yao, G., et al., "Advanced Warm Aluminum For 0.25µm Plug Filling," Conference Proceedings ULSI XIII (1998) Materials Research Society, pp. 243-249.
Beyer, Gerald P. et al., "Al Speed Fill," Materials Science in Semiconductor Processing 2 (1999), pp. 75-85.

*Primary Examiner*—Calvin Lee (57) ABSTRACT

A system and method is disclosed for adjusting the ratio of deposition times to optimize via density and via fill in an aluminum multilayer metallization process during a manufacturing process of a semiconductor wafer. In a two-step cold/hot aluminum sputtering process via fill becomes more challenging as via density increases. The invention increases the percentage of successful via fills by changing the ratio of the cold/hot deposition times. Denser via structures require extended cold deposition times to compensate for higher via density. The percentage of successful via fills was increased from forty percent (40%) to seventy percent (70%) by changing the ratio of the cold/hot deposition times from 60:40 to 79:21.

15 Claims, 8 Drawing Sheets

SYSTEM AND METHOD FOR ADJUSTING THE RATIO OF DEPOSITION TIMES TO OPTIMIZE VIA DENSITY AND VIA FILL IN ALUMINUM MULTILAYER METALLIZATION

PRIORITY CLAIM TO PROVISIONAL PATENT APPLICATION

The patent application claims priority to U.S. Provisional Patent Application Ser. No. 60/565,340 filed on Apr. 26, 2004.

TECHNICAL FIELD OF THE INVENTION

The present invention is generally directed to manufacturing technology for semiconductor devices and, in particular, to a system and method for adjusting the ratio of deposition times to optimize via density and via fill in aluminum multilayer metallization in a manufacturing process for a semiconductor wafer.

BACKGROUND OF THE INVENTION

Due to ever increasing device densities and shrinking feature dimensions, successful interconnect metallization has become very critical and challenging. Process engineers are faced with difficult topologies in ultra-large scale integrated (ULSI) circuit manufacturing. With shrinking design rules for ULSI circuits, obtaining adequate step-coverage on high aspect ratio contacts and vias has become critical.

In a majority of manufacturing lines, metallization engineers have utilized tungsten-plug technology followed by aluminum physical vapor deposition (PVD) for backend metallization. These steps have been adopted to take advantage of the excellent contact and via fill ability of the tungsten chemical vapor deposition (CVD) process. However, tungsten-plug technology has some significant deficiencies. See, for example, W. Robi, et al., Conference Proceedings ULSI XIII Materials Research Society, p. 251, 1998.

High contact and via resistance, and the cost associated with the tungsten-plug process have attracted metallization engineers to try alternative aluminum-based technologies for contact and via fill. These technologies offer the tremendous advantages of process simplicity and low cost. For the same reasons, other approaches such as a two-step cold/hot fill, forcefill technology, low-pressure deposition and aluminum low pressure seed (ALPS) technologies have also been investigated. See, for example, B. Zhao et al., IEEE IEDM, p. 353, 1996; J.-H. Yun, Appl. J. Phys., Vol. 40, p. 5105, 2001; T. Guo et al., Thin Solid Films, 332, p. 319, 1998; and G. Yao et al., Conference Proceedings ULSI XIII Materials Research Society, p. 243, 1998.

Via fill using a two-step cold/hot aluminum sputter metallization process depends on via density. Via fill using a two-step cold/hot aluminum sputter metallization process also depends upon the ratio of the cold deposition time to the hot deposition time. For a successful via fill, a conformal aluminum layer must be formed with the cold deposition process. The conformal aluminum layer acts as a seed and wetting layer to promote metal reflow during the subsequent hot deposition process. Insufficient cold deposition of the aluminum prevents hot reflow of the aluminum into the vias. Excessive cold deposition of aluminum creates voids and bridges across the via entrances.

There is a need in the art for a system and method that is capable of maximizing the number of successful via fills in aluminum multilayer metallization in a manufacturing process for a semiconductor wafer.

SUMMARY OF THE INVENTION

To address the above-discussed deficiencies of the prior art, it is a primary object of the present invention to provide a system and method for adjusting the ratio of deposition times to optimize via density and via fill in aluminum multilayer metallization in a manufacturing process for a semiconductor wafer.

In one advantageous embodiment of the method of the invention a first deposition time period is selected for depositing aluminum on a semiconductor wafer in a cold deposition process. Then a second deposition time period is selected for depositing aluminum on the semiconductor wafer in a subsequent hot deposition process. Then the value of the first deposition time period is adjusted and the value of the second deposition time period is adjusted to optimize the percentage of via fills in said semiconductor wafer that are successfully completed.

During the manufacturing process of the semiconductor wafer aluminum is deposited on the semiconductor wafer in a cold deposition process for a period of time that is equal to the adjusted value of the first deposition time period. Then aluminum is deposited on the semiconductor wafer in a subsequent hot deposition process for a period of time that is equal to the adjusted value of the second deposition time period. The percentage of successfully completed via fills in the semiconductor wafer is maximized.

It is an object of the present invention to provide a system and method for adjusting the ratio of cold/hot deposition time periods to optimize via density and via fill in aluminum multilayer metallization in a manufacturing process of a semiconductor wafer.

It is also an object of the present invention to provide a system and method for adjusting a value of a first deposition time period for a cold deposition process that enables the cold deposition process to create a seed layer that promotes aluminum reflow during a subsequent hot deposition process.

It is yet another object of the present invention to provide a system and method for adjusting a value of a second deposition time period for a hot deposition process that enables the hot deposition process to create an adequate reflow during the hot deposition process.

It is still another object of the present invention to provide a system and method for adjusting a value of a first deposition time period of a cold deposition process to increase the value of the first deposition time period for semiconductor wafers that have an increased value of via density.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art should appreciate that they may readily use the conception and the specific embodiment disclosed as a basis for modifying or designing other structures for carrying out the same purposes of the present invention. Those skilled in the art should also realize that such equivalent constructions do not depart from the spirit and scope of the invention in its broadest form.

Before undertaking the Detailed Description of the Invention below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior uses, as well as future uses, of such defined words and phrases.

BRIEF DESCRIPTION OF THE DRAWINGS

For a more complete understanding of the present invention and its advantages, reference is now made to the following description taken in conjunction with the accompanying drawings, in which like reference numerals represent like parts.

DETAILED DESCRIPTION OF THE INVENTION

FIGS. 1 through 11, discussed below, and the various embodiments used to describe the principles of the present invention in this patent document are by way of illustration only and should not be construed in any way to limit the scope of the invention. Those skilled in the art will understand that the principles of the present invention may be implemented in any type of suitably arranged semiconductor device.

Figure 1:
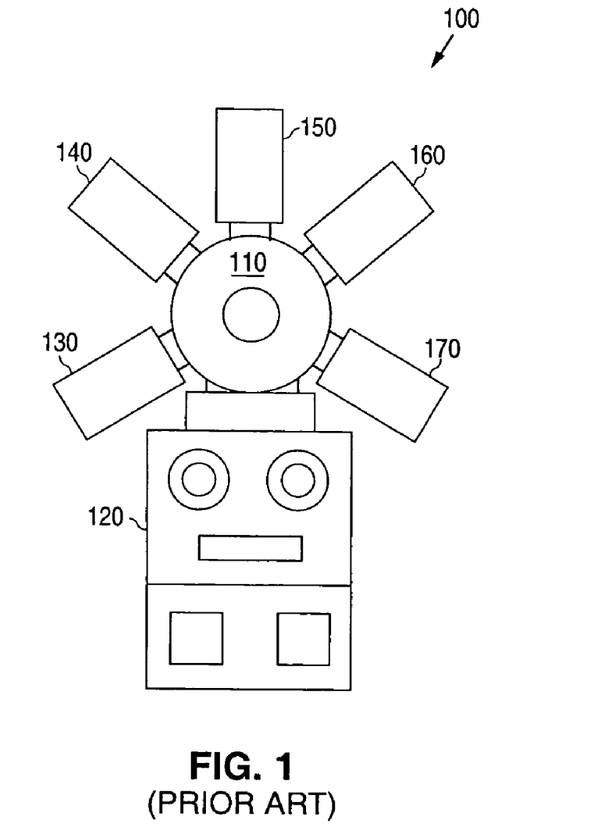
FIG. 1 illustrates a schematic representation of an exemplary prior art physical vapor deposition (PVD) system.

FIG. 1 illustrates a schematic representation of an exemplary prior art physical vapor deposition (PVD) system 100. PVD system 100 comprises a transfer module 110 and a degas and cooling module 120. PVD system 100 also comprises a radio frequency (RF) etch chamber 130, a first aluminum deposition module 140, a collimated titanium (Ti) and titanium nitride (TiN) module 150, a second aluminum deposition module 160, and an uncollimated titanium nitride (TiN) module 170. The structure and operation of physical vapor depositions systems are well known in the art and will not be discussed in detail in this document.

PVD system 100 may be used for sputtering barrier, aluminum and anti-reflective coating films. PVD system 100 may comprise a Varian™ M2i PVD system. PVD system 100 provides a high vacuum ($5 \times 10^{-8}$ Torr), a good temperature uniformity ($\pm 5°$ C.) and a high vacuum wafer transfer.

During the measurements taken using the PVD system 100 the pressure of all chambers was set at 5×10$^{-8}$ Torr.

PVD system 100 was used to investigate the effect of the ratio of deposition times and via density on via fill in aluminum multilayer metallization. Several devices with different densities were fabricated on a one hundred fifty millimeter (150.0 mm) diameter silicon wafers using a two-level interconnection process with stacked vias and contacts. All experiments were performed on the via-one level where a one and one fourth micron (1.25 μm) film of tetra-ethyl-orthosilicate (TEOS) was used as an interlevel dielectric. A collimated titanium (Ti) and titanium nitride (TiN) film was uniformly deposited as a barrier layer while an uncollimated titanium nitride (TiN) film was uniformly deposited as an anti-reflective coating (ARC) layer. The wafer sequence through the PVD system 100 and other process details are set forth below in Table One.

TABLE ONE

Wafer Sequence and Process Details

| Process | Thickness (nanometers) | Wafer Temperature (° C.) | Process Time (seconds) |
| --- | --- | --- | --- |
| Degas | — | 525 | 60 |
| RF Preclean | 300 | 300 | 120 |
| Collimated Ti | 30 | 55 | 15 |
| Collimated TiN | 30 | 55 | 75 |
| Al (0.5% Cu) | 550 | 490 | 260 |
| ARC (Uncollimated TiN) | 25 | 250 | 20 |

An aluminum film (containing one half percent (0.5%) copper (Cu)) having a thickness of five hundred fifty nanometers (550 nm) was deposited on wafers with via sizes of three fourths of a micron (0.75 μm) wide and one and one fourth micron (1.25 μm) deep. Aluminum deposition was performed using a two-step PVD process consisting of a cold deposition followed by a hot deposition. The cold deposition layer acts as a seed layer on which aluminum reflow occurs during subsequent hot deposition.

In the cold deposition step, an aluminum nucleation layer was deposited at a sputter power of ten and eight tenths kilowatt (10.8 kW) with backside argon (BSA) off. Backside argon (BSA) acts as a thermal coupling agent between the wafer and the heater. During the "BSA off" portion of the step, the wafer is thermally de-coupled from the heater. This results in minimum heat transfer and thereby ensures the lowest possible wafer temperature. A continuous aluminum nucleation layer is formed on the via bottoms and sidewalls.

During the hot deposition step, aluminum is deposited at a sputter power of forty eight hundredths of a kilowatt (0.48 kW) with backside argon (BSA) on. With the wafer thermally coupled to the heater, the temperature of the wafer is elevated to four hundred ninety degrees Celsius (490° C.). Reflow is primarily achieved due to the surface diffusion of aluminum at this temperature. During aluminum reflow, step coverage is improved by planarizing the surface, filling all spaces and smoothing the edges.

In order to better understand the effect of via density on via fill, devices with different via densities were fabricated. Via density varied from closely packed vias with a via density of one via per area of four square microns (4 μm$^2$) to loosely packed vias with via densities of one via per area of thirty six square microns (36 μm$^2$) and of one via per area of forty eight square microns (48 μm$^2$).

Figure 2A:
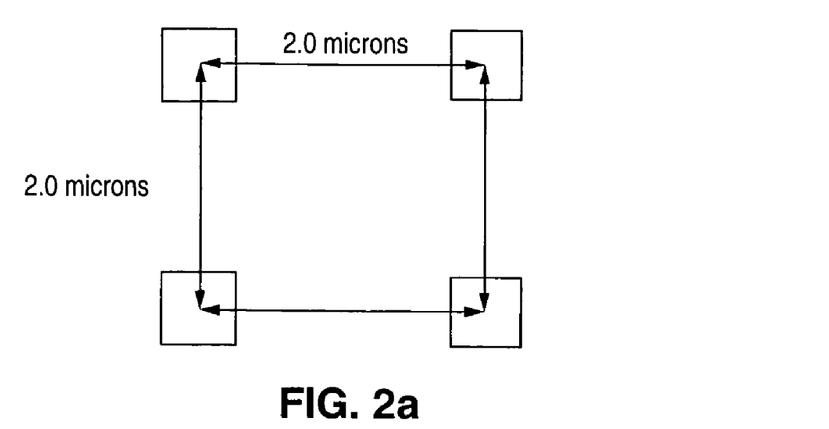
FIG. 2a illustrates a schematic representation of a via array layout with one via per an area of approximately four (4) square microns.
Figure 2B:
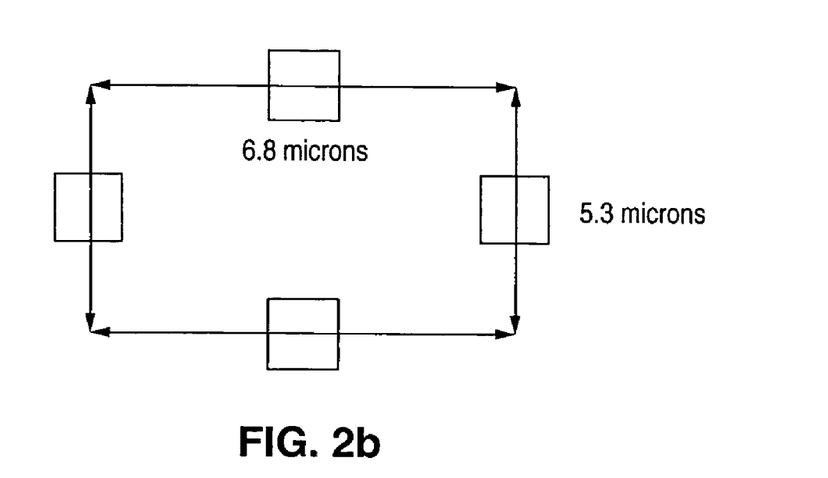
FIG. 2b illustrates a schematic representation of a via array layout with one via per an area of approximately thirty six (36) square microns.
Figure 2C:
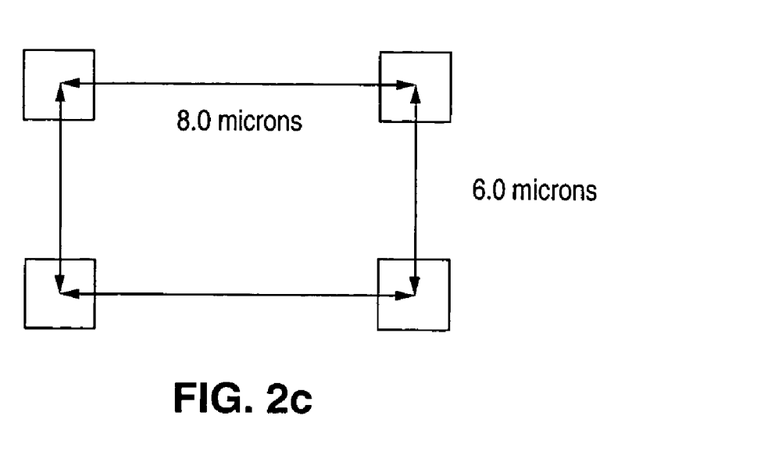
FIG. 2c illustrates a schematic representation of a via array layout with one via per an area of approximately forty eight (48) square microns.

FIG. 2a illustrates a schematic representation of a via array layout with one via per an area of approximately four square microns (4 μm$^2$). FIG. 2b illustrates a schematic representation of a via array layout with one via per an area of approximately thirty six square microns (36 μm$^2$). FIG. 2c illustrates a schematic representation of a via array layout with one via per an area of approximately forty eight square microns (48 μm$^2$). FIGS. 2a, 2b and 2c depict the arrangements and spacings of the via layouts.

One objective of the experiments was to better understand the effect of a cold only deposition process on via fill and the effect of a hot only deposition process on via fill. Another objective of the experiments was to better understand the effect of via density on via fill using a fixed value of a cold/hot ratio of deposition times. Another objective of the experiments was to better understand the effect of cold/hot ratios of deposition times on via fill in a dense via structure.

Figure 3:
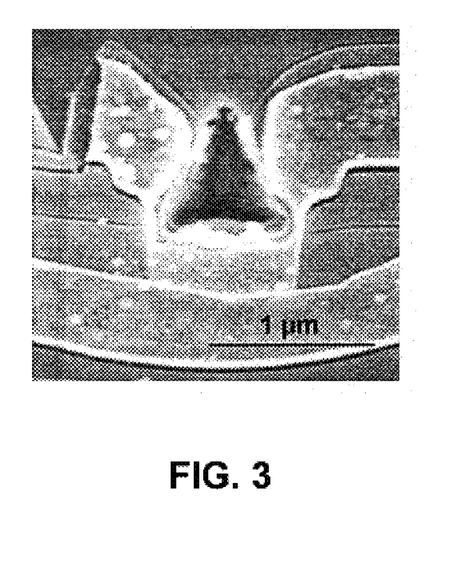
FIG. 3 illustrates a cross sectional view of a scanning electron micrograph of an unfilled via showing a cavity in the unfilled via.

After the aluminum deposition step was performed, the wafers were inspected under an optical microscope in order to determine the resulting percentage of via fill. It was found that the unfilled vias have a dimple or an open cavity that appears under the optical microscope as a black dot in the surface of the wafer. The wafers were also cross-sectioned and inspected using a scanning electron microscope (SEM) to compare the extent of the via fill. FIG. 3 illustrates a scanning electron micrograph of a cross section of an unfilled via showing a cavity in the via.

A first experiment was performed to explore the effect of all cold and all hot deposition steps of the sputtering process on via fill. A two-step aluminum sputtering process consists of the formation of a continuous conformal aluminum seed layer and the reflow of aluminum on top of the seed layer. To better understand this mechanism, three wafers were deposited using one hundred percent (100%) cold deposition process while another three wafers were deposited using one hundred percent (100%) hot deposition process. The experimental conditions are set forth below in Table Two. The results show the limitations of all cold and all hot deposition approaches.

TABLE TWO

| | Experimental Conditions of 100% Cold and 100% Hot Deposition Process | | |
| --- | --- | --- | --- |
| | Deposition Power (kW) | Deposition Time (seconds) | Backside Argon (BSA) |
| Cold Only | 10.8 | 33 | Off |
| Hot Only | 0.48 | 565 | On |

Figure 4A:
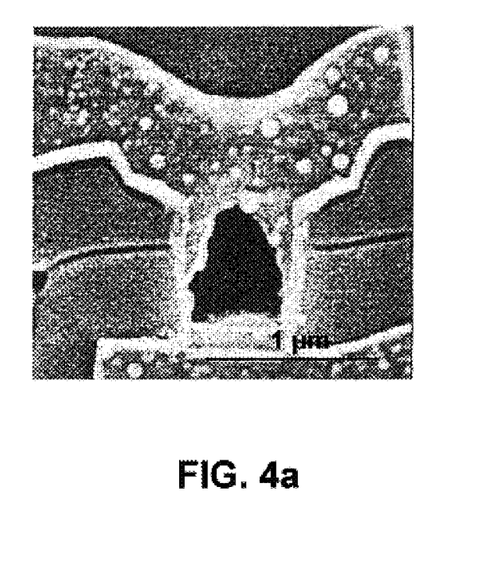
FIG. 4a illustrates a cross sectional view of a scanning electron micrograph of a via processed with all cold deposition showing a keyhole type void formed due to no reflow and due to overhang created at the via opening.

All wafers processed with 100% cold deposition showed a keyhole type void across all vias as illustrated in FIG. 4a. During the high power cold deposition step, an overhang is created at the via openings. The directional nature of the overhang growth blocks aluminum flow into the via bottom, thereby creating a keyhole shaped void as shown in FIG. 4c.

Figure 4B:
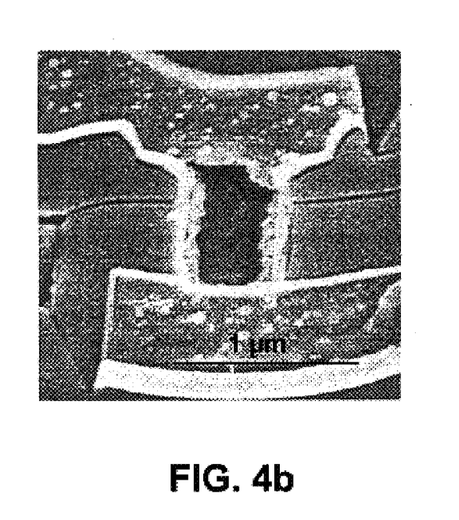
FIG. 4b illustrates a cross sectional view of a scanning electron micrograph of a via processed with all hot deposition showing a void formed due to an absence of a seed layer.
Figure 4C:
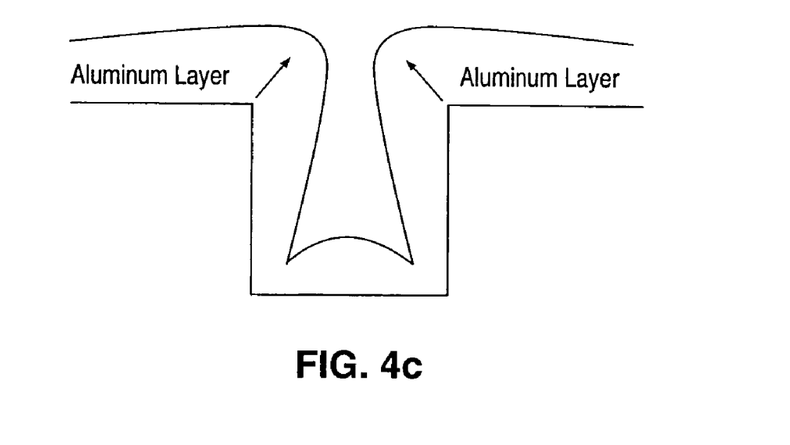
FIG. 4c illustrates a cross sectional view of a schematic representation of a via showing the directional growth of an aluminum overhang at the via entrance during all cold deposition.

Conversely, wafers processed with 100% hot deposition also showed voids across all vias since aluminum did not reflow into the vias as shown in FIG. 4b. Continuous coverage of first nucleation was absent which restricted reflow and left the vias unfilled.

A second experiment was performed to better understand how layouts with different densities react to a fixed value of cold/hot ratio of deposition times. Devices with various via densities were subjected to a deposition process using 60:40 cold/hot ratio of deposition times. The ratio of deposition times was kept constant and the via density was treated as a variable during the experiment.

The results of the second experiment are set forth below in Table Three. It is seen that a fixed cold/hot ratio of 60:40 failed to completely fill vias across all via density layouts.

TABLE THREE

Percentage Via Fill as a Function of Via Density

| Ratio of Deposition Times | Via Density of One Via/4 μm² | Via Density of One Via/36 μm² | Via Density of One Via/48 μm² |
|---|---|---|---|
| 60:40 | 50%–60% Voids | No Voids | No Voids |

Figure 5A:
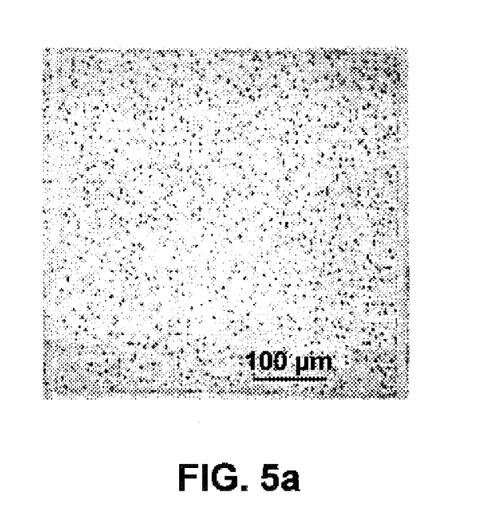
FIG. 5a illustrates a plan view of a wafer processed with a cold/hot ratio of 60:40 showing a via array layout having a density of one via per an area of four (4) square microns.
Figure 5B:
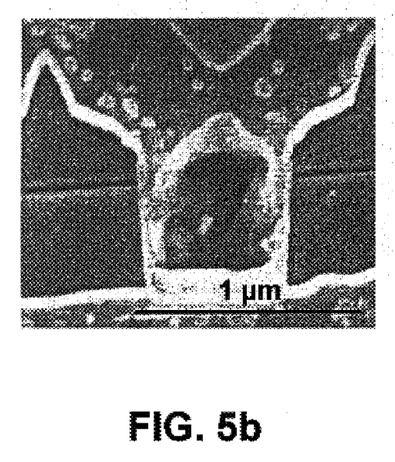
FIG. 5b illustrates a cross sectional view of a scanning electron micrograph of a via processed with a cold/hot ratio of 60:40 from a via array layout having a density of one via per an area of four (4) square microns.
Figure 5C:
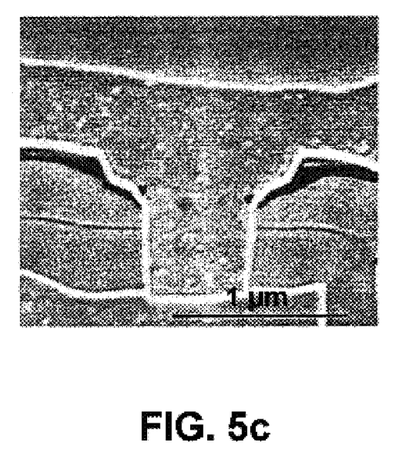
FIG. 5c illustrates a cross sectional view of a scanning electron micrograph of a via processed with a cold/hot ratio of 60:40 from a via array layout having a density of one via per an area of thirty six (36) square microns.
Figure 6A:
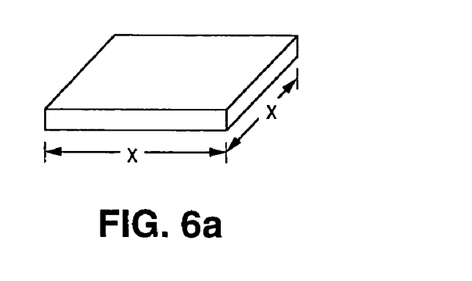
FIGS. 6a to 6d illustrate four drawings that show how the surface area of a wafer increases as the number of vias within the wafer increases.
Figure 6B:
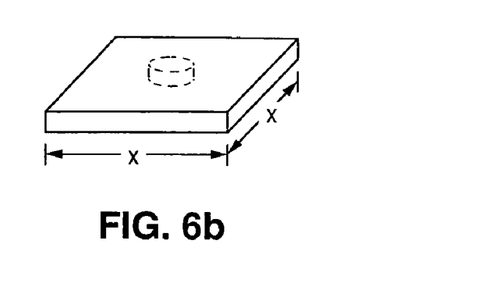
Figure 6C:
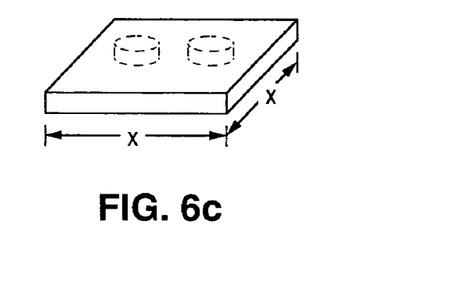
Figure 6D:
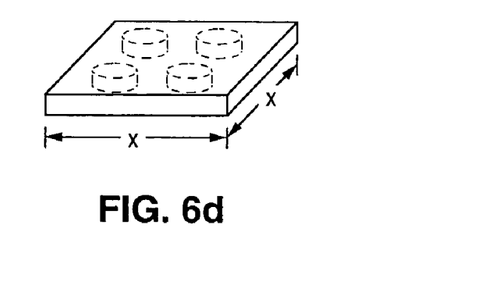

Via layouts with the highest density (One via per 4 μm²) had fifty to sixty percent (50%–60%) of their vias unfilled as shown in FIG. 5a and in FIG. 5b. Devices with a comparatively lower via density (e.g., One via per 36 μm² and one via per 48 μm²) showed an excellent fill as shown in FIG. 5c.

A fixed ratio of deposition times failed to provide a conformal seed layer across all via density structures. This suggests a profound effect of via density on via fills. Step coverage achieved during cold deposition is a function of via density. A higher via density structure is prone to poor step coverage during the cold step as well as the hot step. If the step coverage during the cold portion of the step is inadequate then the reflow step is insufficient to completely fill the vias, even at extended hot deposition time. Regardless of the via density, an integral and robust seed layer is required for a successful via fill.

FIG. 6 illustrates four drawings that show how the surface area of a wafer increases as the number of vias within the wafer increases. Consider a square portion of a wafer with an original surface area that equal to $X^2$ (as shown in FIG. 6a). If one via (represented by a cylinder in dotted outline) is placed within the wafer, then the surface area increases and is now equal to $X^2$ plus the area of the sidewall of the via (as shown in FIG. 6b). If two vias are placed within the wafer, then the surface area increases and is now equal to $X^2$ plus two times the area of the sidewall of a via (as shown in FIG. 6c). If four vias are placed within the wafer, then the surface area increases and is now equal to $X^2$ plus four times the area of the sidewall of a via (as shown in FIG. 6d).

The total surface area increases with the increase in the number of the vias per given area. With an increase in via density, the total sidewall area that must be covered by the seed layer increases. As via density/side wall area increases, fixed cold deposition time will fail to provide an adequate seed layer thickness over the increasing surface area. Insufficient coverage of the first nucleation layer (seed layer thickness) will result in an incomplete via fill.

A third experiment was performed to determine whether a conformal seed layer can be formed on all vias in a dense structure by varying the cold/hot ratio while maintaining sufficient reflow. The cold/hot ratio of the deposition step was varied from 60:40 to 92:08 in increments of seven (7) steps on via structures with densities of one via per four (4) square microns (4 μm²).

TABLE FOUR

Percent Via Fill for Various Cold/Hot Ratios

| Cold Depos. Time (s) | Cold Depos. Power-Time (kW-s) | Cold Depos. Thickness (nm) | Hot Depos. Time(s) | Hot Depos. Power-Time (kW-s) | Cold/hot Ratio | Via Fill (%) |
|---|---|---|---|---|---|---|
| 18 | 194.4 | 324 | 243.00 | 116.6 | 60:40 | 40 |
| 22 | 237.6 | 396 | 165.59 | 79.5 | 72:28 | 60 |
| 23 | 248.4 | 414 | 146.24 | 70.2 | 75:25 | 70 |
| 24 | 259.2 | 432 | 126.88 | 60.9 | 79:21 | 70 |
| 25 | 270.0 | 450 | 107.53 | 51.6 | 82:18 | 60 |
| 26 | 280.8 | 468 | 88.17 | 42.3 | 85:15 | 60 |
| 27 | 291.6 | 486 | 68.82 | 33.0 | 88:12 | 50 |
| 28 | 302.4 | 504 | 49.46 | 23.7 | 92:08 | 40 |

Figure 7:
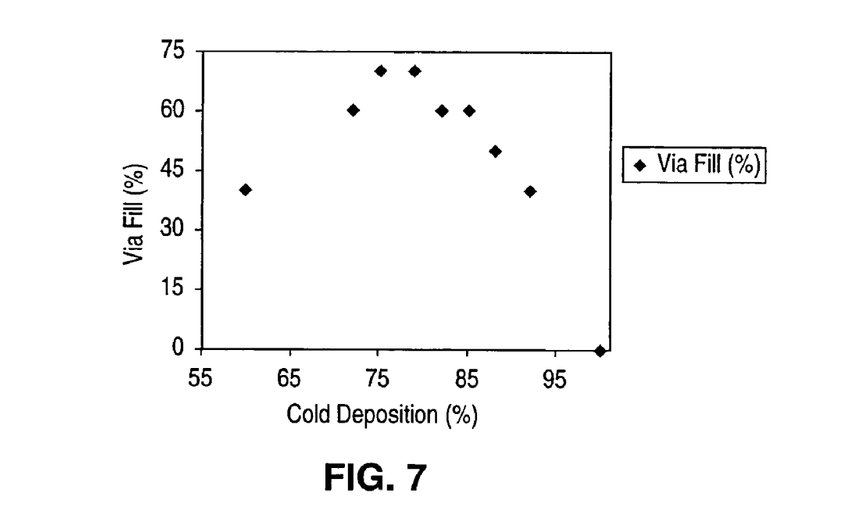
FIG. 7 illustrates a graph showing a plot of percentage via fill versus percentage of cold deposition.
Figure 8A:
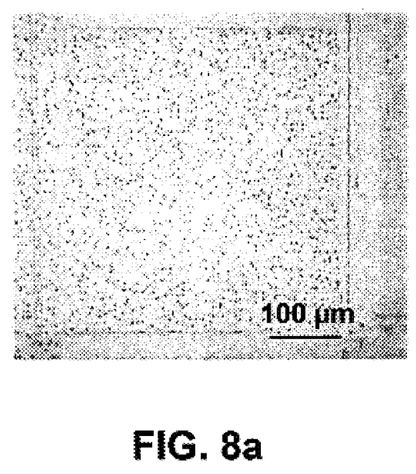
FIG. 8a illustrates a plan view of a wafer processed with a cold/hot ratio of 60:40 showing a plurality of via voids in the via array layout.
Figure 8B:
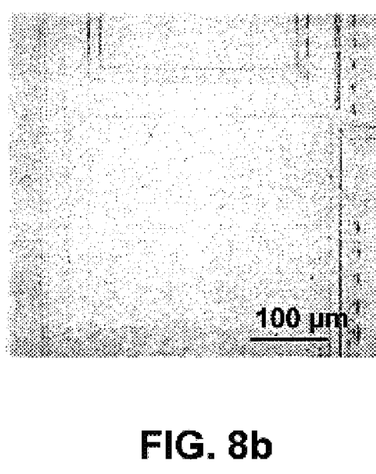
FIG. 8b illustrates a plan view of a wafer processed with a cold/hot ratio of 79:21 showing excellent via fill in the via array layout.

The ratio of deposition times and via fill percentage are set forth in Table Four above. The via fill is plotted as a function of cold deposition in FIG. 7. The via fill is plotted as a function of cold deposition to provide a linear scale x-axis. A cold/hot ratio change from 60:40 to 79:21 improves the via fill from forty percent (40%) to seventy percent (70%). The result for the cold/hot ratio of 60:40 is shown in FIG. 8a. The result for the cold/hot ratio of 79:21 is shown in FIG. 8b. A change in the percentage of via fill is observed as a result of the change in seed layer thickness and reflow characteristics.

Figure 9A:
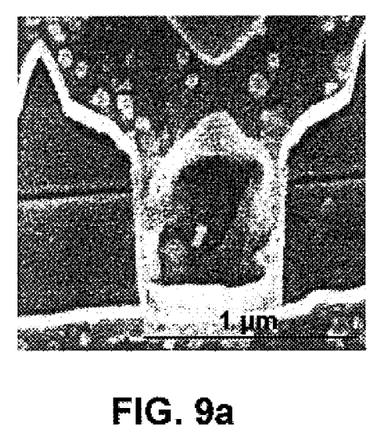
FIG. 9a illustrates a scanning electron micrograph cross sectional view of a via processed with a cold/hot ratio of 60:40 showing a void in the via.
Figure 9B:
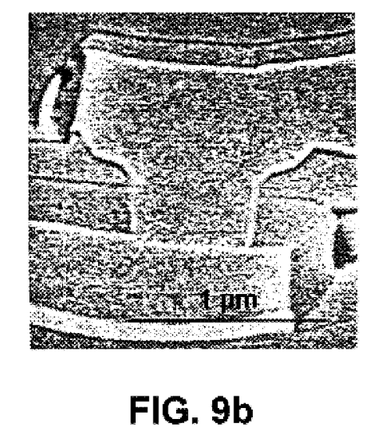
FIG. 9b illustrates a scanning electron micrograph cross sectional view of a via processed with a cold/hot ratio of 79:21 showing an excellent fill in the via.

FIG. 9a illustrates a scanning electron micrograph cross sectional view of a via processed with a cold/hot ratio of 60:40 showing a void in the via. FIG. 9b illustrates a scanning electron micrograph cross sectional view of a via processed with a cold/hot ratio of 79:21 showing an excellent fill in the via.

Figure 10A:
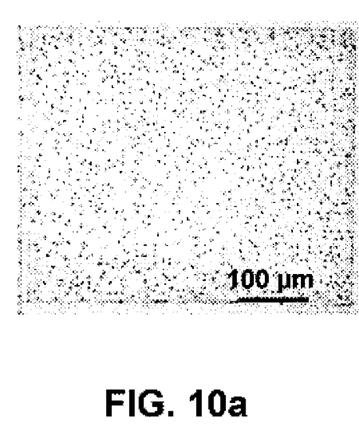
FIG. 10a illustrates a scanning electron micrograph plan view of a dense via array showing the via fill processed with a cold/hot ratio of 60:40 showing a poor via fill.

The trend in via fills on dense via structures with an increase in cold/hot ratio is shown in FIGS. 10a–10d. FIG. 10a shows a scanning electron micrograph plan view of a dense via array showing the via fill processed with a cold/hot ratio of 60:40. At a ratio of 60:40 poor via fill is seen due to insufficient seed layer thickness.

Figure 10B:
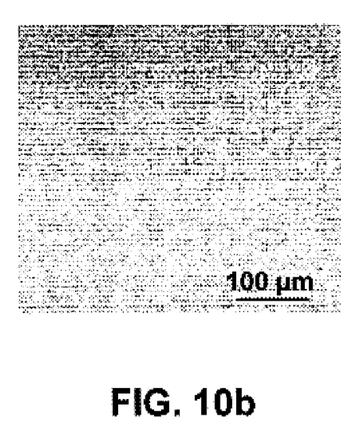
FIG. 10b illustrates a scanning electron micrograph plan view of a dense via array showing the via fill processed with a cold/hot ratio of 78:28 showing an excellent via fill.
Figure 10C:
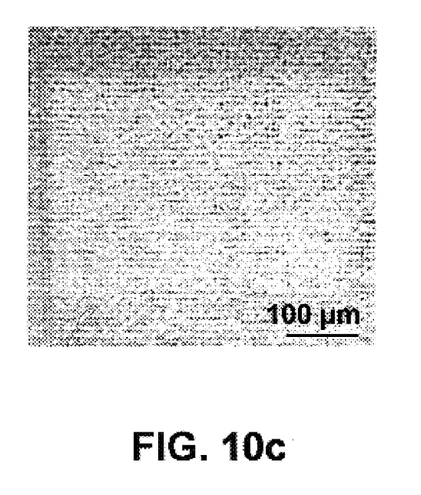
FIG. 10c illustrates a scanning electron micrograph plan view of a dense via array showing the via fill processed with a cold/hot ratio of 75:25 showing an excellent via fill.

FIG. 10b shows a scanning electron micrograph plan view of a dense via array showing the via fill processed with a cold/hot ratio of 78:28. FIG. 10c shows a scanning electron micrograph plan view of a dense via array showing the via fill processed with a cold/hot ratio of 75:25. Both FIG. 10b and FIG. 10c show an excellent via fill due to the balance of the cold/hot ratios (72:28 and 75:25). The longer cold deposition time improves the seeding characteristics by providing more integral and robust seed layer, which improves the fill properties in dense via layout.

Key factors for reliable filling of vias using cold/hot approach are low base pressure and continuous coverage of the first nucleation layer. See, for example, Z. Hu et al., Thin Solid Films, 235, p. 367, 1994. For a successful via fill, conformal deposition of cold layer is of the utmost importance so that the aluminum can flow during the hot deposition step. See, for example, G. P. Meyer et al., Mater. Sci. Semicond. Processing 2, p. 75, 1999.

Figure 10D:
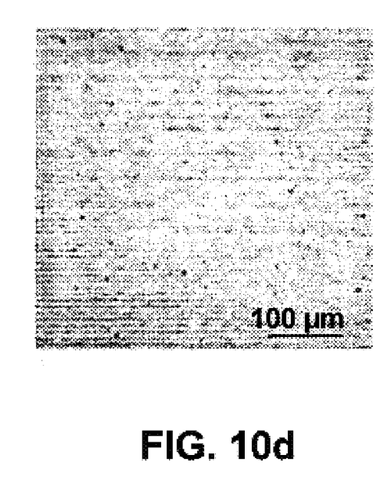
FIG. 10d illustrates a scanning electron micrograph plan view of a dense via array showing the via fill processed with a cold/hot ratio of 85:15 showing voids due to insufficient reflow.

FIG. 10d shows a scanning electron micrograph plan view of a dense via array showing the via fill processed with a cold/hot ratio of 85:15. The dense via array in FIG. 10d shows voids due to insufficient reflow. With a cold/hot ratio of 85:15, reflow time dropped to 88.17 seconds and via fill dropped from seventy percent (70%) to fifty percent (50%).

Figure 10E:
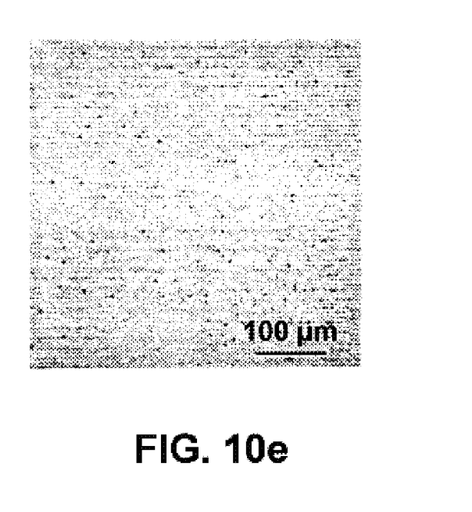
FIG. 10e illustrates a scanning electron micrograph plan view of a dense via array showing the via fill processed with a cold/hot ratio of 88:12 showing voids due to insufficient reflow.

FIG. 10e shows a scanning electron micrograph plan view of a dense via array showing the via fill processed with a cold/hot ratio of 88:12. The dense via array in FIG. 10e also shows voids due to insufficient reflow. With a cold/hot ratio of 88:12 the via fill becomes almost impossible because very little or almost no reflow of aluminum occurs.

Figure 11:
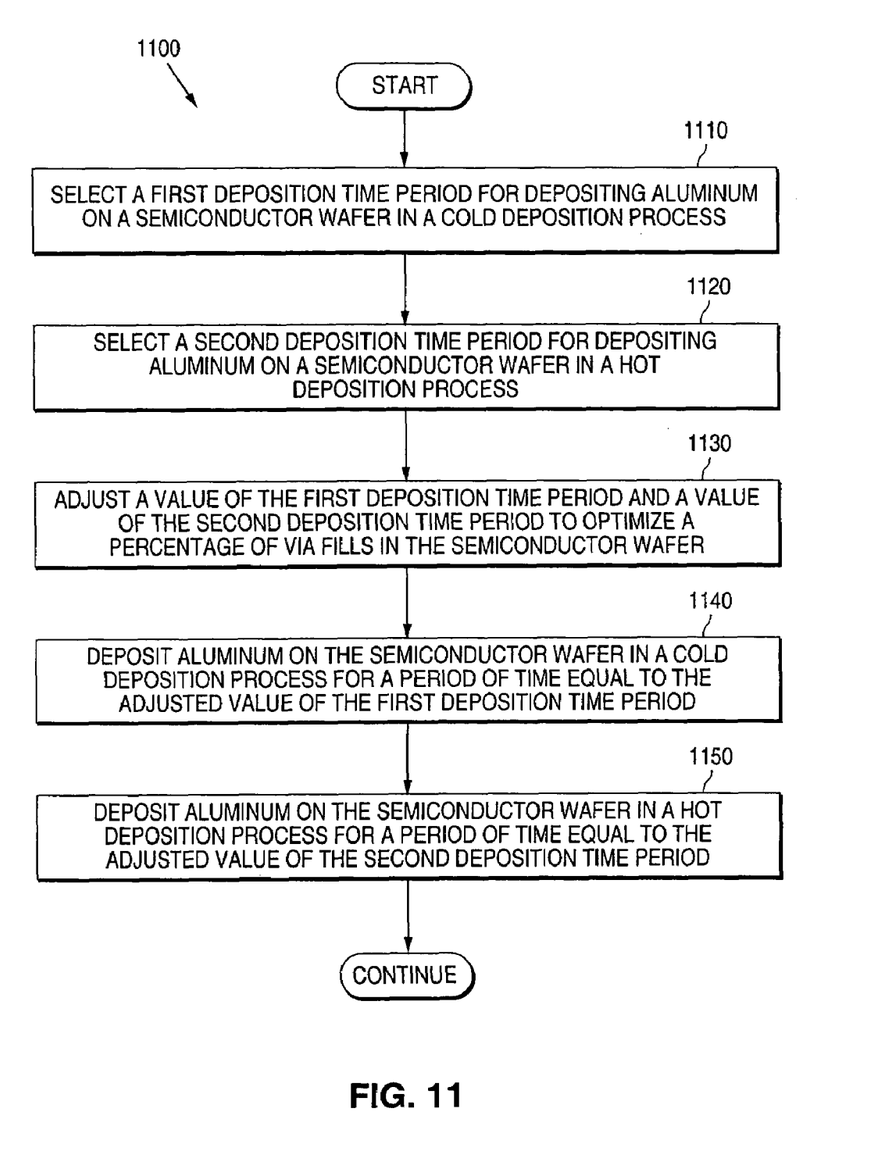
FIG. 11 illustrates a flow chart showing the steps of an advantageous embodiment of a method of the present invention.

FIG. 11 illustrates a flow chart 1100 showing the steps of an advantageous embodiment of a method of the present invention. In the first step of the method a first deposition time period is selected for depositing aluminum on a semiconductor wafer in a cold deposition process (step 1110). Then a second deposition time period is selected for depositing aluminum on the semiconductor wafer in a hot deposition process (step 1120). Then the value of the first deposition time period and the value of the second deposition time period are adjusted to optimize a percentage of via fills in the semiconductor wafer (step 1130).

Then aluminum is deposited on the semiconductor wafer in a cold deposition process for a period of time equal to the adjusted value of the first deposition time period (step 1140). Then aluminum is deposited on the semiconductor wafer in a hot deposition process for a period of time equal to the adjusted value of the second deposition time period (step 1150).

Via fill using a two-step cold/hot aluminum sputter metallization process depends critically on via density and on the ratio of deposition times. Changing the cold/hot ratio of deposition times was an instrumental step in successfully filling vias on layouts with challenging via density of one (1) via per area of four square microns (4 mm$^2$). The percentage of via fills is improved by optimizing the cold/hot ratio of deposition times.

For a successful via fill, a conformal aluminum layer must be formed with cold deposition which acts as a seed and wetting layer to promote metal reflow during the subsequent hot deposition. Insufficient cold deposition prevents hot reflow into the vias while excessive cold deposition creates voids and bridges across the via entrances. To obtain uniform continuous seed layer on high via density layouts, cold deposition times need to be optimized while maintaining sufficient reflow. Proper balance of cold deposition seed layer and hot deposition reflow has to be optimized for successful via fill.

Although the present invention has been described with an exemplary embodiment, various changes and modifications may be suggested to one skilled in the art. It is intended that the present invention encompass such changes and modifications as fall within the scope of the appended claims.

What is claimed is:

1. A method for optimizing a percentage of via fills in a semiconductor wafer during an aluminum multilayer metallization process during a manufacturing process of said semiconductor wafer, said method comprising the steps of:
    selecting a first deposition time period for depositing aluminum on said semiconductor wafer in a cold deposition process;
    selecting a second deposition time period for depositing aluminum on said semiconductor wafer in a hot deposition process; and
    adjusting a first value of said first deposition time period and a second value of said second deposition time period to optimize said percentage of via fills in said semiconductor wafer wherein increasing said first value of said first deposition time period and decreasing said second value of said second deposition time period increases said percentage of via fills in said semiconductor wafer.

2. The method as set forth in claim 1 further comprising the steps of:
    depositing aluminum on said semiconductor wafer in a cold deposition process for a period of time equal to said adjusted value of said first deposition time period; and
    depositing aluminum on said semiconductor wafer in a hot deposition process for a period of time equal to said adjusted value of said second deposition time period.

3. The method as set forth in claim 1 wherein said step of adjusting a value of said first deposition time period and a value of said second deposition time period to optimize said percentage of via fills in said semiconductor wafer comprises the steps of:
    selecting a value of said first deposition time period that enables said cold deposition process to create a seed layer that promotes aluminum reflow during said hot deposition process; and
    selecting a value of said second deposition time period that enables said hot deposition process to create an adequate reflow of aluminum during said hot deposition process.

4. The method as set forth in claim 1 further comprising the step of:
    selecting a value of said first deposition time period for said semiconductor wafer that is proportional to a value of via density of said semiconductor wafer.

5. The method as set forth in claim 4 further comprising the step of:
    selecting an increased value of said first deposition time period for said semiconductor wafer when said semiconductor wafer has an increased value of via density.

6. A method for increasing a percentage of via fills in a semiconductor wafer during an aluminum multilayer metallization process during a manufacturing process of said semiconductor wafer, said method comprising the steps of:
    increasing a first value of a first deposition time period for depositing aluminum on said semiconductor wafer in a cold deposition process to a second value of said first deposition time; and
    decreasing a first value of a second deposition time period for depositing aluminum on said semiconductor wafer in a hot deposition process to a second value of said second deposition time,
    wherein the increasing the first value of the first deposition time period and the decreasing the first value of the second deposition time period increases the percentage of via fills in the semiconductor wafer.

7. The method as set forth in claim 6 wherein a ratio of said first value of said first deposition time to said first value of said second deposition time is sixty to forty (60:40).

8. The method as set forth in claim 7 wherein said ratio of said second value of said first deposition time to said second value of said second deposition time is one of: seventy-two to twenty-eight (72:28), seventy-five to twenty five (75:25), and seventy-nine to twenty-one (79:21).

9. A method for increasing a percentage of via fills in a semiconductor wafer during an aluminum multilayer metallization process during a manufacturing process of said semiconductor wafer, said method comprising the steps of:
    decreasing a first value of a first deposition time period for depositing aluminum on said semiconductor wafer in a cold deposition process to a second value of said first deposition time; and
    increasing a first value of a second deposition time period for depositing aluminum on said semiconductor wafer in a hot deposition process to a second value of said second deposition time wherein increasing said first value of said second deposition time period increases said percentage of via fills in said semiconductor wafer.

10. The method as set forth in claim 9 wherein a ratio of said first value of said first deposition time to said first value of said second deposition time is ninety-two to eight (92:08).

11. The method as set forth in claim 10 wherein said ratio of said second value of said first deposition time to said second value of said second deposition time is one of: eighty-eight to twelve (88:12), eighty-five to fifteen (85:15), and eighty-two to eighteen (82:18) and seventy-nine to twenty-one (79:21).

12. A method for optimizing a percentage of via fills in a semiconductor wafer during an aluminum multilayer metallization process that comprises a two-step cold/hot aluminum sputtering process during a manufacturing process of said semiconductor wafer, said method comprising the steps of:
selecting a first deposition time period of a cold deposition process for depositing aluminum that does not prevent aluminum reflow into vias during a subsequent hot deposition process and that does not create voids and bridge across via entrances;
selecting a second deposition time period for a subsequent hot deposition process for depositing aluminum; and
balancing said first deposition time period and said second deposition time period for a given via density of said semiconductor wafer to optimize said percentage of via fills in said semiconductor wafer wherein increasing said first deposition time period and decreasing said second deposition time period increases said percentage of via fills in said semiconductor wafer.

13. The method as set forth in claim 12 wherein said given via density comprises one of: a density of one via per area of four square microns, a density of one via per area of thirty six square microns, and a density of one via per area of forty eight square microns.

14. The method as set forth in claim 12 wherein said step of balancing said first deposition time period and said second deposition time period for a given via density of said semiconductor wafer to optimize said percentage of via fills in said semiconductor wafer comprises the steps of:
changing a value of said first deposition time period; and
changing a value of said second deposition time period.

15. The method as set forth in claim 14 further comprising the steps of:
depositing aluminum on said semiconductor wafer in a cold deposition process for a period of time equal to said changed value of said first deposition time period; and
depositing aluminum on said semiconductor wafer in a hot deposition process for a period of time equal to said changed value of said second deposition time period.

* * * * *